United States Patent
Takao et al.

(10) Patent No.: US 7,815,813 B2
(45) Date of Patent: Oct. 19, 2010

(54) END POINT DETECTION METHOD, END POINT DETECTION DEVICE, AND GAS PHASE REACTION PROCESSING APPARATUS EQUIPPED WITH END POINT DETECTION DEVICE

(75) Inventors: Kazuhisa Takao, Kanagawa (JP); Hiroshi Ikeda, Kanagawa (JP); Hideki Matsumura, Ishikawa (JP); Atsushi Masuda, Ishikawa (JP); Hironobu Umemoto, Ishikawa (JP)

(73) Assignees: Tokyo Ohka Kogyo Co., Ltd., Kanagawa (JP); Japan Advanced Institute of Science and Technology, Ishikawa (JP)

( * ) Notice: Subject to any disclaimer, the term of this patent is extended or adjusted under 35 U.S.C. 154(b) by 27 days.

(21) Appl. No.: 11/991,278

(22) PCT Filed: Aug. 22, 2006

(86) PCT No.: PCT/JP2006/316409
§ 371 (c)(1),
(2), (4) Date: Nov. 3, 2008

(87) PCT Pub. No.: WO2007/029488
PCT Pub. Date: Mar. 15, 2007

(65) Prior Publication Data
US 2009/0263911 A1 Oct. 22, 2009

(30) Foreign Application Priority Data
Sep. 2, 2005 (JP) .............................. 2005-254382

(51) Int. Cl.
*C23F 1/00* (2006.01)

(52) U.S. Cl. ............................. 216/61; 216/58; 216/59; 438/37; 438/43; 438/55; 438/149; 156/345.25

(58) Field of Classification Search ................... 216/61; 156/345.25
See application file for complete search history.

(56) References Cited

U.S. PATENT DOCUMENTS 4,207,137 A * 6/1980 Tretola .......................... 438/10

(Continued)

FOREIGN PATENT DOCUMENTS

JP 2000-294535 10/2000

(Continued)

OTHER PUBLICATIONS

Elert, Glen "Electrical resistance." [online] [retreived on Jan. 22, 2010]. Retreived from the internet:<URL:http://physics.info/electric-resistance/>.*

*Primary Examiner*—Yelena G Gakh
*Assistant Examiner*—Christopher A Hixson
(74) *Attorney, Agent, or Firm*—Carrier, Blackman & Associates P.C.; Joseph P. Carrier; William D. Blackman (57) ABSTRACT

An end point detection method in the case where a catalyst arranged in a treatment chamber of a gas phase reaction processing apparatus is heated at high temperature by supplying electric power thereto and the treatment is carried out by cracking a reaction gas by the catalyst heated at high temperature, comprises the steps of supplying the electric power to the catalyst from a constant current source, detecting electric potential difference between both ends of the catalyst, performing primary differentiation of the detected electric potential difference, and determining an end point of the treatment based on obtained primary differential value.

15 Claims, 5 Drawing Sheets

| U.S. PATENT DOCUMENTS | | | | JP | 2003-007624 | 1/2003 |
|---|---|---|---|---|---|---|
| 6,517,669 B2 * | 2/2003 | Chapman | 156/345.25 | | | |
| 6,592,771 B1 | 7/2003 | Yamanaka et al. | | | | |

FOREIGN PATENT DOCUMENTS

| JP | 2000-294542 | 10/2000 |
|---|---|---|

* cited by examiner

FIG. 6B

END POINT DETECTION METHOD, END POINT DETECTION DEVICE, AND GAS PHASE REACTION PROCESSING APPARATUS EQUIPPED WITH END POINT DETECTION DEVICE

TECHNICAL FIELD

The present invention relates to an end point detection method and an end point detection device suitable for being utilized in the case where a resist film or the like for example is peeled off and removed by a catalyst. Also, the present invention relates to a gas phase reaction processing apparatus equipped with the end point detection device.

BACKGROUND ART

In the conventional art, the method of peeling off and removing a resist film formed on a semiconductor wafer most broadly used is a method of ashing the resist film by exciting an ashing gas with electric discharge plasma. However, due to the heterogeneity and fluctuation or the like of a plasma electric field in this conventional ashing method, the heterogeneity in an electric field is developed on the wafer and it is difficult to obtain a homogeneous ashing performance. This results in a negative influence on the yield of the semiconductor device as a product. Further, it is difficult to produce a homogeneous plasma discharge over a large area, so that there are some drawbacks to the treatment of large-diameter semiconductor wafer.

As a peeling-off method for solving the above mentioned problems, there is already known the peeling-off method using the catalyst (for example, see a patent reference 1). In this peeling-off method, the catalyst such as a tungsten wire is arranged above the semiconductor wafer to be treated, and a reaction gas is cracked by heating the catalyst to a high temperature and bringing the reaction gas into contact with the catalyst of high temperature. Then, the peeling-off treatment is carried out by applying the cracked reaction gas to the wafer. Then, the peeling-off treatment is carried out by applying the cracked reaction gas to the wafer.

Patent reference 1: Japanese patent application publication No. 2000-294535.

DISCLOSURE OF THE INVENTION

Problem to be Solved by the Invention

Incidentally, the peeling-off method disclosed in the above patent reference 1 does not suffer the negative effects due to the heterogeneity of plasma whereby the uniform peeling-off treatment is able to be carried out over the entire surface of the wafer, and therefore it is expected as the peeling-off method suitable for the treatment of the large-diameter wafer. However, a method of detecting an end point of the pealing-off treatment is not established. Therefore, this peeling-off method has not been put to practical use yet.

Since this kind of peeling-off method is different from the conventional ashing method using the electric discharge plasma, it is not possible to apply the conventional end point detection method of the plasma ashing method. Accordingly, if the end point detection method is established in the peeling-off method, it is possible to put the resist peeling-off method which is expected as a next generation peeling-off method into practical use.

In view of the above mentioned points, an object of the present invention is to provide the end point detection method and the end point detection device which are capable of accurately detecting the end point in the peeling-off method, and also to provide the gas phase reaction processing apparatus which is equipped with the end point detection device.

Means for Solving the Problem

An end point detection method according to the present invention to be used in the case where a catalyst arranged in a treatment chamber is heated at high temperature by supplying electric power thereto and the treatment is carried out by exciting a reaction producing gas by the catalyst heated at high temperature, comprises the steps of supplying the electric power to the catalyst from a constant current source, detecting electric potential difference between both ends of the catalyst, performing primary differentiation of the detected electric potential difference to obtain primary differential value, and determining an end point of the treatment based on the obtained primary differential value.

Namely, energy released from the catalyst during peeling-off treatment is spent on the peeling-off treatment while the remaining energy is radiated to heat component members of a surrounding space. Accordingly, when the peeling-off is completed, the energy released from the catalyst is decreased and the temperature of the catalyst itself goes up. The electrical resistance of the catalyst of metallic material increases as the temperature climbs. Therefore, when the constant current is supplied to the catalyst, the electric potential difference between both ends of the catalyst sharply rises at the end point of the peeling-off treatment.

In the end point detection method according to the present invention, focusing on such characteristics of the catalyst, the electric potential difference between both ends of the catalyst is detected and the end point of the peeling-off treatment is detected based on the detected potential difference. Since the potential difference generated in the catalyst is able to be easily measured with an existing voltmeter, it is possible to get the end point of the peeling-off treatment by a simple method in the case where actually the peeling-off of the film (for example, resist film) on the substrate material is carried out.

An end point detection device according to the present invention, in which a catalyst arranged in a treatment chamber is heated at high temperature by supplying electric power thereto and the treatment is carried out by exciting a reaction producing gas by the catalyst heated at high temperature, comprises a constant current source being used as an electric power source for supplying the electric power to the catalyst, means for detecting electric potential difference between both ends of the catalyst, means for performing primary differentiation of the detected potential difference to output a primary differential value, and means for determining an end point of the treatment based on the primary differential value.

Since the end point detection device of the present invention comprises the constant current source being used as the electric power source means for supplying the electric power to the catalyst, means for detecting the electric potential difference between both ends of the catalyst, means for performing the primary differentiation of the detected potential difference to output the primary differential value, and means for determining the end point of the treatment based on the primary differential value, it is possible to get the end point of the peeling-off treatment by the simple method in the case where actually the peeling-off of the film (for example, resist film) on the substrate material is carried out.

A gas phase reaction processing apparatus according to the present invention comprises a treatment chamber into which a reaction gas is introduced, a substrate material to be treated being arranged in the treatment chamber, a catalyst for cracking the reaction gas introduced into the treatment chamber, an electric power source for supplying electric power to the catalyst, an electrode constituent element having the catalyst, and an end point detection device comprising means for detecting electric potential difference between both ends of the catalyst, means for performing primary differentiation with respect to the detected potential difference to output a primary differential value, and means for determining an end point of the treatment based on the outputted primary differential value.

Since the gas phase reaction processing apparatus of the present invention is equipped with the end point detection device comprising means for detecting the electric potential difference between both ends of the catalyst, means for performing the primary differentiation with respect to the detected potential difference to output the primary differential value, and means for determining the end point of the treatment based on the outputted primary differential value, the stable peeling-off may be performed without peeling-off residue, even in the case where there is the difference in thickness of the resist films between the substrate materials (semiconductor wafers), for example.

Effects of the Invention

According to the present invention, the end point in the peeling-off treatment of the film (for example, resist film) on the substrate material can be accurately detected, so that the peeling-off treatment of the substrate material using the catalyst can be put into practical use. Thus, it is possible to provide the gas phase reaction processing apparatus of which the operability is remarkably improved and which has high performance and reliability.

BRIEF DESCRIPTION OF THE DRAWINGS

FIGS. 2-A, 2-B and 2-C are schematic views of an electrode constituent element;

FIG. 3-A is a graph showing a relationship between treatment time and temperature of a catalyst, and FIG. 3-B is a graph showing a relationship between the treatment time and electric potential difference between both ends of the catalyst;

FIG. 4-A is a graph showing a relationship between the treatment time and primary differential value, and FIG. 4-B is a schematic diagram showing an example of an end point detection circuit according to an embodiment of the present invention;

FIG. 5-A is a graph showing a relationship between the treatment time and secondary differential value, and FIG. 5-B is a schematic diagram showing another example of the end point detection circuit; and FIGS. 6-A and 6-B are graphs for explaining the implementation of end point detection by supplying electric current (electric voltage) while keeping the temperature of the catalyst constant.

BEST MODE FOR CARRYING OUT THE INVENTION

Figure 1:
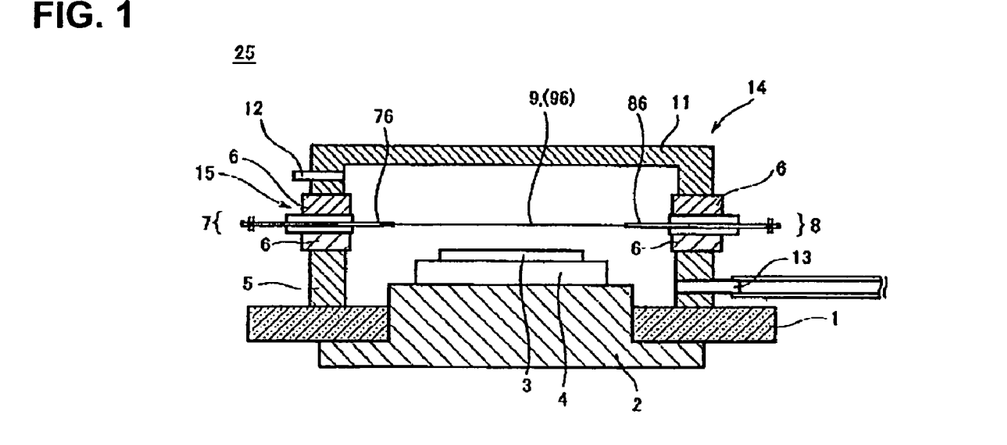
FIG. 1 is a schematic cross sectional view showing an embodiment of a gas phase reaction processing apparatus according to the present invention.
Figure 2A:
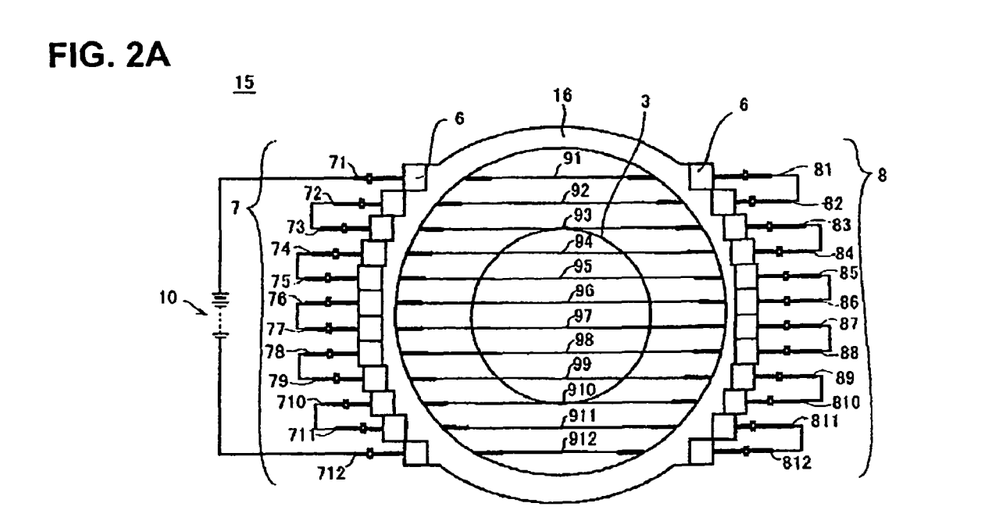
Figure 2B:
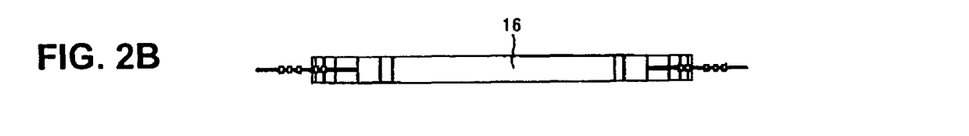
Figure 2C:
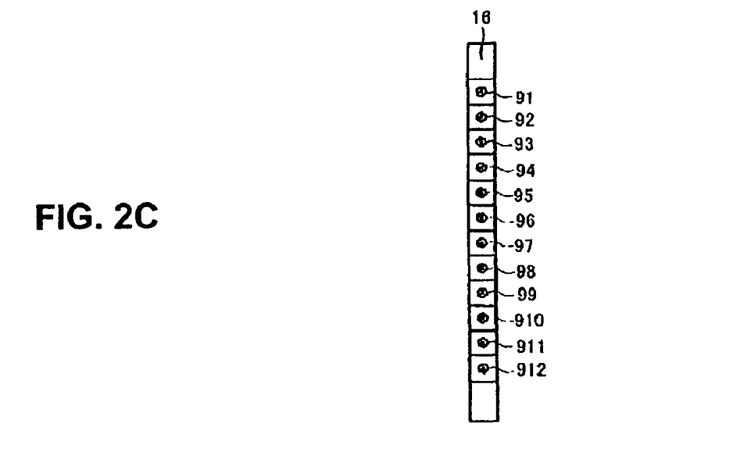

Embodiments of the present invention will be explained hereunder with reference to the accompanying drawings. FIG. 1 is a schematic cross sectional view showing an embodiment of a gas phase reaction processing apparatus according to the present invention. FIG. 2-A is a top plan view showing a state of removing a cap from the gas phase reaction processing apparatus of FIG. 1, FIG. 2-B is a front view of FIG. 2-A, and FIG. 2-C is a side view, viewed from a lateral side (right side) of the drawing of FIG. 2-A.

In the gas phase reaction processing apparatus 25 of this embodiment, as shown in FIGS. 1 and 2, a stage 2 is hermetically fitted in a base member 1 through a seal member (not shown). On this stage 2 there is arranged a susceptor 4 which supports a substrate material (semiconductor wafer) 3 to be treated. A cylindrical base ring 5 is hermetically fitted through a seal member on the base member 1. On this base ring 5 there are hermetically mounted a first terminal group 7 and a second terminal group 8 which support each of catalysts 9, and a terminal base 6 of insulating material which electrically insulates and supports each of the first terminal group 7 and the second terminal group 8. These first and second terminal groups 7, 8 and the terminal base 6 form an electrode constituent element as referred to later. A cap 11 is hermetically mounted on the terminal base 6.

An outlet 13 for discharging a reaction gas generated by a gas phase reaction processing is provided in the base ring 5 while an inlet 12 for introducing a reaction gas into a treatment chamber as referred to later is provided in the cap 11. Reference character 10 denotes an electric power source means for supplying electric power to each of the catalysts 9.

Incidentally, the stage 2 is set to be movable upwardly and downwardly in connection with an elevator mechanism (not shown), whereby the change of the wafer 3 is performed though the upward and downward movement of the stage 2. Moreover, on a surface of the wafer 3 is formed an organic film (not shown) which is to be peeled off and removed by a gas phase reaction treatment.

In the gas phase reaction processing apparatus 25 of the above mentioned structure, the treatment chamber 14 is comprised of the base member 1, the stage 2, the base ring 5, the terminal base 6 and the cap 11.

The electrode constituent element 15 is comprised of a plurality of wire-shaped catalysts 9 which extend substantially parallel to each other, the first terminal group 7 having a plurality of terminals each of which supports one end (located on the left side in FIG. 2-A) of each of the catalysts 9, the second terminal group 8 having a plurality of terminals each of which supports the other end (located on the right side in FIG. 2-A) of each of the catalysts 9, and the terminal base 6 for electrically insulating and supporting the first and second terminal groups 7 and 8 which are arranged opposite to each other on either side of the catalyst 9.

The terminal base 6 has cylindrical bases on which the first and second terminal groups 7 and 8 opposed to each other are mounted. The first and second terminal groups 7 and 8 have twelve terminals (71-712, 81-812), respectively. These terminals (71-712, 81-812) are electrically insulated from each other. One end side of each of the first and second terminal groups 7 and 8 is located in the treatment chamber 14 so as to support one end of each of the catalysts 9 while the other end side thereof is located outside of the treatment chamber 14.

The end of each of the catalysts 9 is held by the first and second terminal groups 7 and 8. In the first and second terminal groups 7 and 8, neighboring terminals are alternately connected to each other, and two terminals (71 and 712 in FIG. 2-A) located on both ends are connected through an outwardly provided electrical connection member to the electric power source means 10, so that twelve catalysts 9 (91-912) are electrically connected in series to the electric power source means 10. Thus, a uniform electric current is supplied to each of the catalysts 9 (91-912).

As the catalyst 9, a metal wire of high melting point such as a tungsten wire, for example, may be used. Further, other than this, there may be used metal wires of high melting point such as platinum or molybdenum, for example, and wire-shaped ceramics on which a metal film of high melting point such as tungsten, platinum, molybdenum, palladium or vanadium is formed.

In this embodiment, particularly, the gas phase reaction processing apparatus 25 of the above mentioned structure is provided with an end point detection device which comprises a potential difference detection means for detecting an electric potential difference between both ends of the catalyst 9, means for performing primary differentiation with respect to the detected potential difference thereby to output a primary differential value, and means for determining an end point of peeling-off based on the outputted primary differential value.

Next, the explanation will be made with respect to the case where the peeling-off of the resist film formed on the wafer is performed by the use of the gas phase reaction processing apparatus 25 of such structure, that is, the case where the gas phase reaction treatment is processed.

At first, the elevator mechanism (not shown) connected with the stage 2 is operated to move the stage 2 downwardly, and the wafer 3 to be treated is placed on the susceptor 3. Then, the stage 2 is moved upwardly to have the stage 2 hermetically fitted to the base member 1, whereby the wafer 3 is arranged within the treatment chamber 14.

Next, after the gas within the treatment chamber 14 is discharged to reduce the pressure, the treatment is started. The reaction gas is introduced through the inlet 12 to the treatment chamber 14, and the electric power source means 10 is operated to resistance-heat the catalyst 9. At this time, $H_2$ gas of a reducing gas is used as the reaction gas. Also, a constant current power source is used as the electric power source means 10.

Then, the temperature of each of the catalysts 9 gradually climbs, for example, up to about 1800° C. The $H_2$ gas introduced into the treatment chamber 14 is cracked by receiving heat energy from the catalysts 9 and irradiated on the surface of the wafer 3. At that time, the resist film is peeled off by a chemical reaction and by the action of collision or the like against the surface of the resist film. Herein, the reaction gas generated during the gas phase reaction treatment process is discharged through the outlet 13 to the outside. Thus, the damage to the wafer is reduced, so that the resist film can be peeled off from the surface of the wafer 3 without causing the damage by ultraviolet rays.

Next, the explanation will be made with reference to an embodiment of an end point detection method used in the above mentioned treatment. First, in order to facilitate understanding, how the end point detection method is invented will be explained.

The inventors prepared the wafer 3 on which the resist film is formed during the manufacturing process of the semiconductor device and the wafer 3 on which the resist film is not formed, and these wafers 3 were placed within the gas phase reaction processing apparatus 25 as shown in FIG. 1 to perform the peeling-off treatment under the same condition, whereby the observation on a temperature change of the catalyst 9 and on a voltage change between both ends of the catalyst 9 was carried out.

Figure 3A:
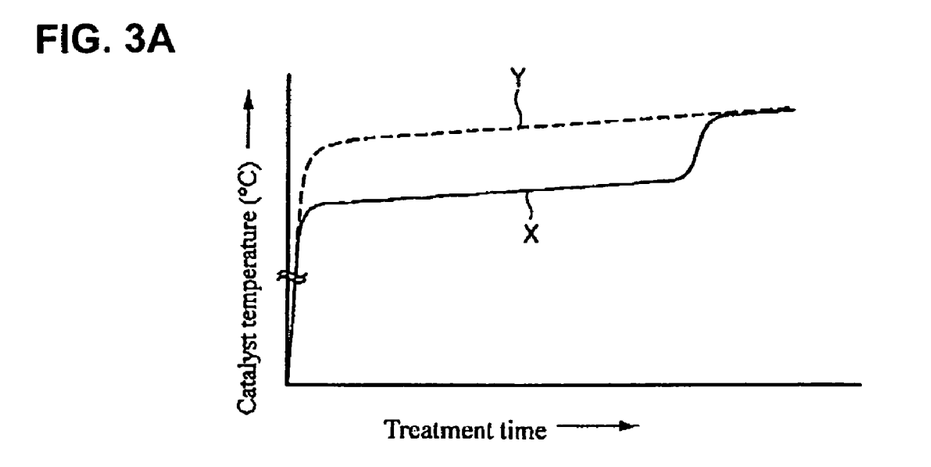
Figure 3B:
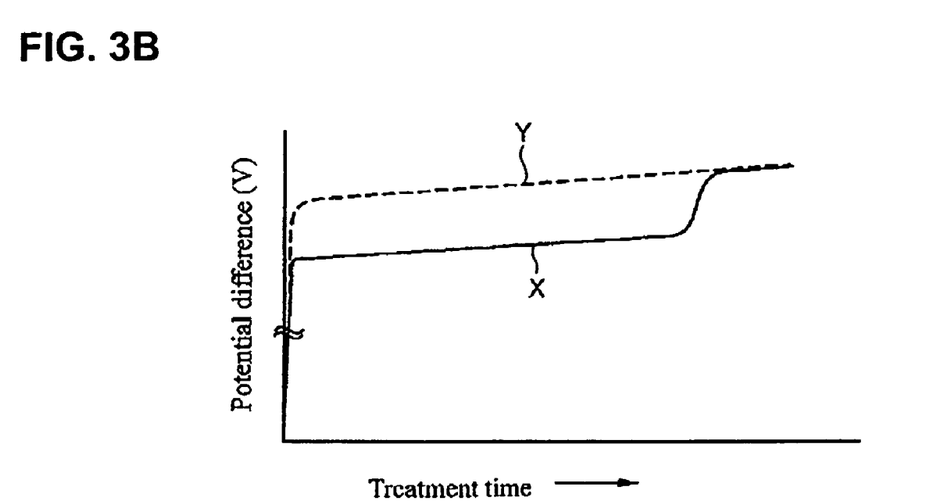

FIG. 3-A is a graph showing a relationship between the treatment time in the peeling-off treatment process and the temperature of the catalyst 9, wherein a solid line X denotes the temperature change of the wafer 3 on which the resist film is formed, and a dashed line Y denotes the temperature change of the wafer on which the resist film is not formed. Also, FIG. 3-B is a graph showing the chronological change of the voltage between both ends of the catalyst 9, wherein a solid line X denotes the voltage change of the wafer 3 on which the resist film is formed, and a dashed line Y denotes the voltage change of the wafer 3 on which the resist film is not formed. Herein, the temperature of the catalyst 9 was measured from the outside with a radiation thermometer.

The catalyst 9 is a resistance heating element. Therefore, when the electric current is supplied from the constant current power source 10 to the catalyst 9, the catalyst 9 generates Joule heat to immediately rise in temperature up to a stable level, and thereafter the temperature rises slowly. As shown by the dashed line Y of FIG. 3-A, the wafer 3 having no resist film merely rose slowly in temperature with the lapse of the treatment time. In the wafer 3 having the resist film as shown by the solid line X of FIG. 3-A, the temperature during the treatment was lower than that of the wafer having no resist film. The temperature went up slowly during the treatment and rose sharply from the time when it appears that the peeling-off treatment of the resist film was almost completed. Thereafter, the temperature rose as slowly as that of the wafer 3 having no resist film.

Next, the change in electric potential difference of the catalyst was observed. In the case of the wafer 3 having no resist film, as shown by the dashed line Y in FIG. 3-B, the voltage reached a substantially stable level soon after starting the supply of the constant current and thereafter merely rose slowly. In the case of the wafer 3 having the resist film, as shown by the solid line X in FIG. 3-B, the voltage also reached a substantially stable level soon after starting the supply of the constant current, thereafter rose slowly, and rose sharply from the time it looks as if the peeling-off treatment of the resist film was almost completed, so that it reached the same voltage value as the wafer 3 having no resist film. Then, the voltage went up slowly in the same manner as the wafer 3 having no resist film.

From the results of such observation, the following can be deduced.

Since the catalyst is a resistance heating element, it starts rising in temperature after supply of an electric current and releases heat energy by radiation and conduction. At this time, it is understood that in the case of the wafer 3 having no resist film, the electrical energy supplied from the power source and the energy released into the outside balance each other to reach the stable temperature and there is a slow rise in temperature with the rise in temperature of the members constituting the treatment chamber 14. In comparison with this, in the case of the wafer 3 having the resist film, the peeling-off which has the resist vaporized is carried out with the rise in temperature, and the energy is spent on this pealing-off treatment. Therefore, it is understood that the amount of the released energy is greater than the wafer 3 having no resist film, so as to be stabilized at the lower temperature than the wafer 3 having no resist film. Then, it is understood that since there is no energy to be spent on the peeling-off when the resist film is peeled off and removed, the amount of the energy released from the catalyst 9 also is decreased whereby there is the sharp rise in temperature. Accordingly, it is understood that the point of time when the catalyst 9 sharply rises in temperature from the stabilized temperature is the end point of the peeling-off treatment.

Further, with respect to the change in potential difference of the catalyst 9, the following can be deduced. Since the catalyst 9 is a metallic material, the electric voltage value increases with the rise in temperature thereof. Therefore, the supplied energy and the released energy balance so as to stabilize the potential difference. Then, in the case of the wafer 3 having no resist film, the treatment chamber 14 is heated by the energy released from the catalyst 9, whereby the potential difference rises slowly with the rise in temperature of the treatment chamber. In comparison with this, in the case of the wafer 3 having the resist film, the energy is spent for the peeling-off, whereby the temperature of the catalyst 9 becomes lower than the wafer 3 having no resist film and the resistance value of the catalyst 9 also decreases. As a consequence, it is understood that it is stabilized at the lower potential difference than the wafer 3 having no resist film. It is understood that since there is no energy spent on the peeling-off when the peeling-off is completed, the temperature of the catalyst 9 rises sharply and the potential difference between both ends of the catalyst 9 also rises sharply.

Incidentally, the peeling-off treatment was carried out with respect to the wafer 3 having the resist film. The peeling-off treatment was stopped at the point of time when the temperature of the catalyst 9 rises sharply, namely, at the point of time when the potential difference of the catalyst 9 rises sharply. When the wafer 3 was taken out of the treatment chamber 14 and inspected, the resist film was completely peeled off.

From the above, in the end point detection method of this embodiment, the point of time when there is the sharp rise in the potential difference between both ends of the catalyst 9 after the peeling-off treatment is concluded as the end point of the peeling-off treatment. Thus, the end point of the treatment is detected based on the potential difference of the catalyst 9.

More specifically, the end point detection method comprises a step of supplying the electric power from the constant current power source 10 to the catalyst 9, a step of detecting the potential difference between both ends of the catalyst 9, a step of performing the primary differentiation of the detected potential difference, and a step of determining the end point of the treatment based on the obtained primary differential value. With this structure, it is possible to easily obtain the end point of the peeling-off treatment with the simple method. Moreover, even in the case where the irregularity in film thickness of the resist film was developed among the wafers 3, for example, it is possible to perform the stable peeling-off without peeling-off residue of the resist film.

Figure 4A:
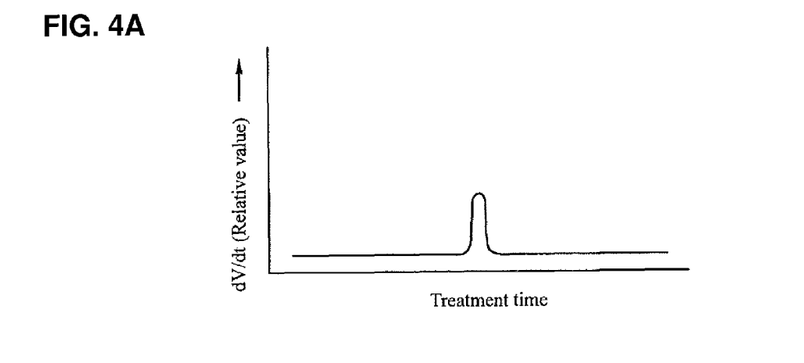

Further, other than the end point detection method as above, there is another method as below. For example, when the primary differential value of the potential difference of the catalyst 9 is represented in FIG. 4-A, a peak appears at the point of time when the potential difference rises sharply. Accordingly, when the primary differential value obtained by detecting the differential of the potential difference between both ends of the catalyst 9 is compared with the threshold value, the end point of the peeling-off treatment is detected.

Figure 4B:
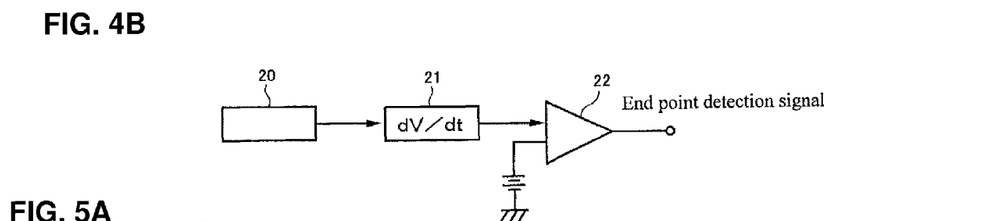

More specifically, an end point detection circuit is shown in FIG. 4-B as an example, in which the primary differentiation of an output value from a voltmeter 20 is performed by a primary differentiation circuit 21, and the differential value is compared with a predetermined threshold value by a comparator 22, whereby the end point of the peeling-off treatment is detected. In this case, since the primary differentiation of the potential difference between both ends of the catalyst 9 is detected as a peak value, it is possible to easily detect the end point of the peeling-off treatment by comparing the primary differential value with the threshold value.

Figure 5A:
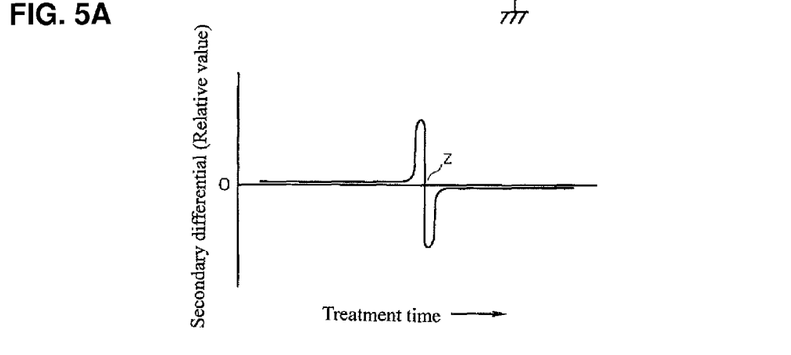

Furthermore, as shown in FIG. 5-A, for example, when a secondary differential value of the potential difference is represented, a zero cross is generated. Therefore, the end point of the peeling-off treatment is able to be detected by obtaining the zero cross of the secondary differential value.

Figure 5B:
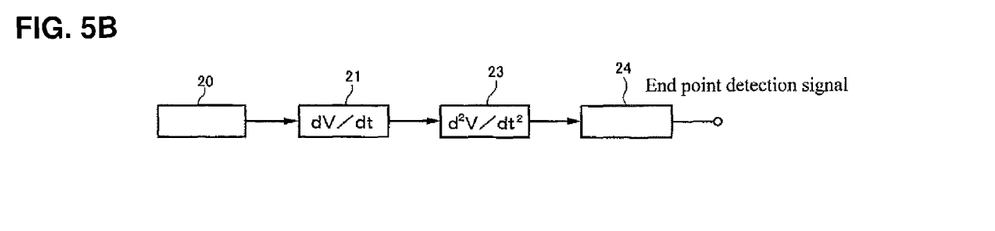

More specifically, an end point detection circuit is shown in FIG. 5-B as an example, in which a primary differential value outputted from a primary differentiation circuit 20 is outputted to a secondary differentiation circuit 23 to perform secondary differentiation so as to obtain a secondary differential, and a zero cross point (for example, Z) is detected by a detector, 24, whereby the end point of the peeling-off treatment can be determined. In this case, since the zero cross point Z is obtained by the secondary differentiation of the potential difference between both ends of the catalyst, the end point of the peeling-off treatment can be easily determined.

Figure 6A:
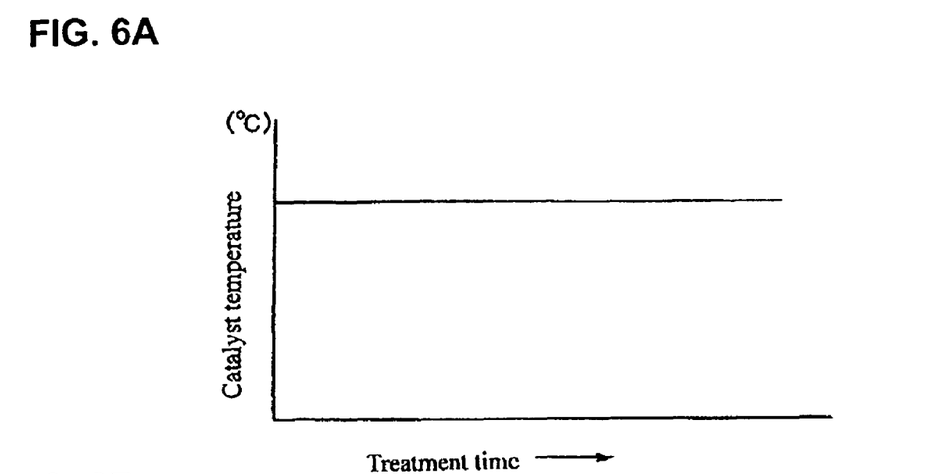
Figure 6B:
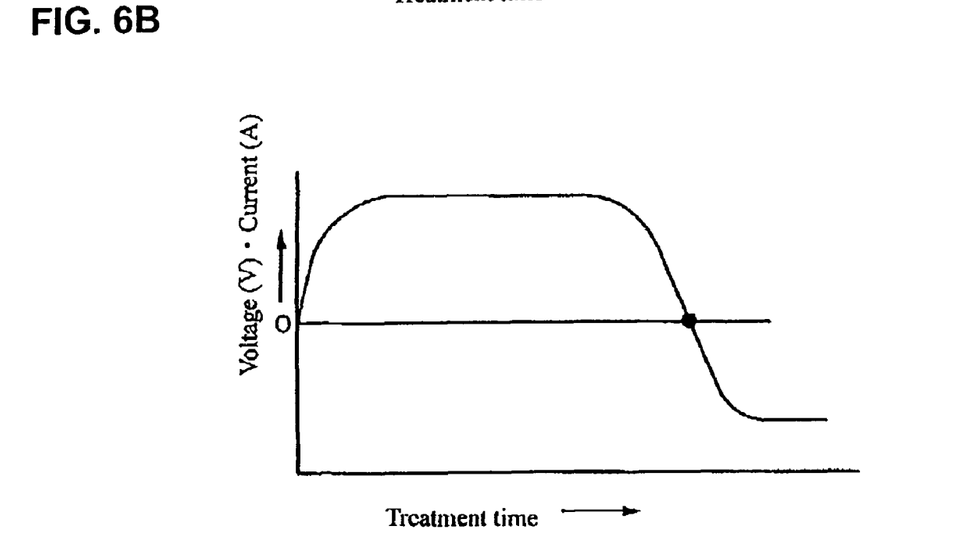

Other than the above, there is another end point detection method as shown below. Namely, a rate of the peeling-off (removal) decreases and throughput deteriorates as the peeling-off treatment of the resist film is carried out. Therefore, it is thought that the removal rate becomes constant by supplying the electric current (voltage) to keep the catalyst 9 at a constant temperature, as shown in FIGS. 6-A and 6-B.

Moreover, when the removal of the resist film is completed, the catalyst 9 rises in temperature. Therefore, the catalyst 9 can be controlled at the constant temperature by decreasing the supply amount of the electric current (voltage). Then, when monitoring the supply amount of the electric current (voltage) value, it is possible to determine the end point of the peeling-off treatment of the resist film.

Incidentally, in the above embodiments, the explanation is made with respect to the case where $H_2$ is used as the reaction gas for carrying out the peeling-off treatment by the reduction reaction. However, other than the above, it is possible to use He, Ne, Ar. N as a dilution gas or a carrier gas, or a reaction gas in which $H_2$ is added to an inert gas comprised of mixture of these gases.

While the invention has been described in its preferred form, it is to be understood that the present invention is not limited to the above described embodiments, but various changes and modifications may be made in the invention without departing from the spirit and scope thereof.

The invention claimed is:

1. An end point detection method for a catalytic gas phase reaction of a coated substrate conducted in a gas phase reaction processing apparatus, comprising the steps of: providing a gas phase reaction processing apparatus having a treatment chamber with a catalyst arranged therein; disposing a coated substrate in the treatment chamber; introducing a reaction gas into the treatment chamber; heating the catalyst at high temperature by supplying electric power to said catalyst from a constant current source so that the reaction gas is cracked by said catalyst heated at high temperature and treats a coating of the substrate, detecting electric potential difference between both ends of said catalyst, performing primary differentiation of the detected electric potential difference to obtain a primary differential value, and determining an end point of the treatment based on the obtained primary differential value.

2. The end point detection method according to claim 1, further comprising the steps of performing secondary differentiation of the primary differential value to obtain a secondary differential value, and determining the end point of the treatment based on the obtained secondary differential value.

3. The end point detection method according to claim 1, further comprising the steps of comparing the primary differential value with a threshold value, and determining the end point of the treatment based on the comparison result.

4. A gas phase reaction processing apparatus comprising a treatment chamber into which a reaction gas is introduced, a substrate material to be treated being arranged in said treatment chamber, a catalyst for cracking the reaction gas introduced into said treatment chamber, an electric power source for supplying electric power to said catalyst, an electrode constituent element having said catalyst, and an end point detection device comprising means for detecting electric potential difference between both ends of said catalyst, means for performing primary differentiation with respect to the detected potential difference to output a primary differential value, and means for determining an end point of the treatment based on the outputted primary differential value.

5. The gas phase reaction processing apparatus according to claim 4, wherein said end point detection device has a comparison means for comparing the detected primary differential value with a threshold value, and wherein the end point of the treatment is determined based on an output from said comparison means.

6. The gas phase reaction processing apparatus according to claim 4, wherein secondary differentiation is further performed with respect to the primary differential value to determine the end point of the treatment based on a zero cross point of the secondary differential value.

7. The gas phase reaction processing apparatus according to claim 4, wherein said electric power source supplies a constant current electric power to said catalyst.

8. The end point detection method according to claim 1, wherein the catalyst includes plural linear catalytic members, each individually retained within the treatment chamber by first and second groups of terminals which respectively support opposite ends of the linear catalytic members.

9. The end point detection method according to claim 8, wherein each of the terminals of the first and second groups of terminals is individually insulated and supported by a terminal base forming part of a side wall of the treatment chamber, and each of the terminals extends from within the chamber to outside of the chamber.

10. The end point detection method according to claim 8, wherein terminals of the first and second terminal groups are serially connected for supplying a constant current to the catalyst.

11. The end point detection method according to claim 1, wherein the gas phase reaction processing apparatus includes a base ring, a terminal base, and cap jointly forming a side wall of the treatment chamber, and said catalyst extends between terminals supported by said terminal base.

12. The gas phase reaction processing apparatus according to claim 4, wherein the catalyst includes plural linear catalytic members, each individually retained within the treatment chamber by first and second groups of terminals which respectively support opposite ends of the linear catalytic members.

13. The gas phase reaction processing apparatus according to claim 12, wherein each of the terminals of the first and second groups of terminals is individually insulated and supported by a terminal base forming part of a side wall of the treatment chamber, and each of the terminals extends from within the chamber to outside of the chamber.

14. The gas phase reaction processing apparatus according to claim 12, wherein terminals of the first and second terminal groups are serially connected for supplying a constant current to the catalyst.

15. The gas phase reaction processing apparatus according to claim 4, wherein a side wall of the treatment chamber is jointly formed by a base ring, a terminal base, and cap, and said catalyst extends between terminals supported by said terminal base.

* * * * *